United States Patent [19]

Steele

[11] Patent Number: 4,959,564
[45] Date of Patent: Sep. 25, 1990

[54] SENSE AMPLIFIER POWER DOWN CIRCUITRY FOR PROGRAMMABLE LOGIC DEVICE

[75] Inventor: Randy C. Steele, Scottsdale, Ariz.

[73] Assignee: SGS-Thomson Microelectronics, Inc., Carrollton, Tex.

[21] Appl. No.: 294,319

[22] Filed: Jan. 6, 1989

[51] Int. Cl.⁵ .................. H03K 17/16; H03K 19/094; H02H 7/20
[52] U.S. Cl. ................................. 307/465; 307/443; 307/468; 307/202.1; 307/530; 365/185
[58] Field of Search ............. 307/443, 448, 451, 465, 307/468, 202.1, 530; 365/184, 185

[56] References Cited

U.S. PATENT DOCUMENTS 4,687,951 8/1987 McElroy ........................... 307/530

Primary Examiner—Stanley D. Miller
Assistant Examiner—Margaret Rose Wambach
Attorney, Agent, or Firm—Richard K. Robinson; Kenneth C. Hill

[57] ABSTRACT

A Programmable Logic Device includes a programmable array arranged in columns and rows. A sense amplifier is connected to each column of the programmable array and includes a power terminal, a grounding terminal, and a programmable switch connecting between the amplifier common line and the grounding terminal.

4 Claims, 5 Drawing Sheets

FUSE

EEPROM

EPROM

MASK

SRAM

SENSE AMPLIFIER POWER DOWN CIRCUITRY FOR PROGRAMMABLE LOGIC DEVICE

BACKGROUND OF THE INVENTION

This invention relates to programmable logic devices and more particularly to sense amplifier circuits for use in a programmable logic device, and in particular to sense amplifier circuits for use in a programmable logic device that are connected to a power down circuit.

Programmable logic devices are user configurable integrated circuits. Examples of such are provided in a hand book/data book published in 1986 by Advanced Micro Devices, Inc., and entitled "Programmable Logic Hand Book/Data Book".

The programmable logic devices contain a set of undedicated inputs, a set of undedicated outputs and a programmable array which permits the logic connection of these inputs to a given output. A simplified logical representation of a prior programmable logic device is illustrated FIG. 1.

The undedicated inputs $IN_1$ through $IN_N$ are the vertical line inputs and are normally called rows. The horizontal lines are called product terms and are indicated as $PT_1$ through $PT_3$. Each product term is connected to the programmable array which may be programed with any of the standard form of memory elements such as mask programmable shunts, fusable links, EPROM cells, EEPROM cells, SRAM cells, DRAM cells, etc. Controlling the state of the different cells within the programmable array can enable the user to determine which of the inputs are to be included in the combining function on each product term.

In any programmable logic device, and particularly the more complex logic devices, the probability of a given application utilizing all of the available product terms on each output is very low. As a result, some programmable logic devices such as that shown in FIG. 1 contain a mechanism to either disable the unused product term in a given design, or disable the extra product term in a more complex programmable logic device such that it emulates a smaller or simpler programmable logic device.

The programmable logic device of FIG. 1 contains an additional row called the product term disable row, PTD. In normal operation the PTD is always selected. If all the product terms are not attached to a given output then one of the programmable switches 8, 9 or 40 is programed to close and thus disable that unneeded product term. This forces the output of a connecting sense amplifier 11 to a fixed logic state independent of the other inputs (such as a don't care state) so as not to adversely affect the output gate 12. The disadvantage with the product term disable on the configuration shown on FIG. 1 is that even an unused output sense amplifier 11 draws or consumes power and is thus uneconomical to use from a power dissipation point of view.

SUMMARY OF THE INVENTION

A programmable logic device includes a programmable array arranged in columns and rows. A sense amplifier is connected to each column of the programmable array and includes a Vcc terminal, a grounding terminal, and a programmable switch connecting between the amplifier common line and the grounding terminal.

The programmable switch can be used either when the sense amplifier is a non-inverting amplifier or an inverting amplifier and in one embodiment of the invention the programmable array circuit is a complementary metal oxide field effect transistor circuit and the sense amplifier is configured with N channel field effect metal oxide silicon transistors.

These and other features and advantages of the invention will be more apparent from a reading of the description of the embodiments in conjunction with the figures in which:

DETAILED DESCRIPTION OF THE PREFERRED EMBODIMENTS

Figure 1:
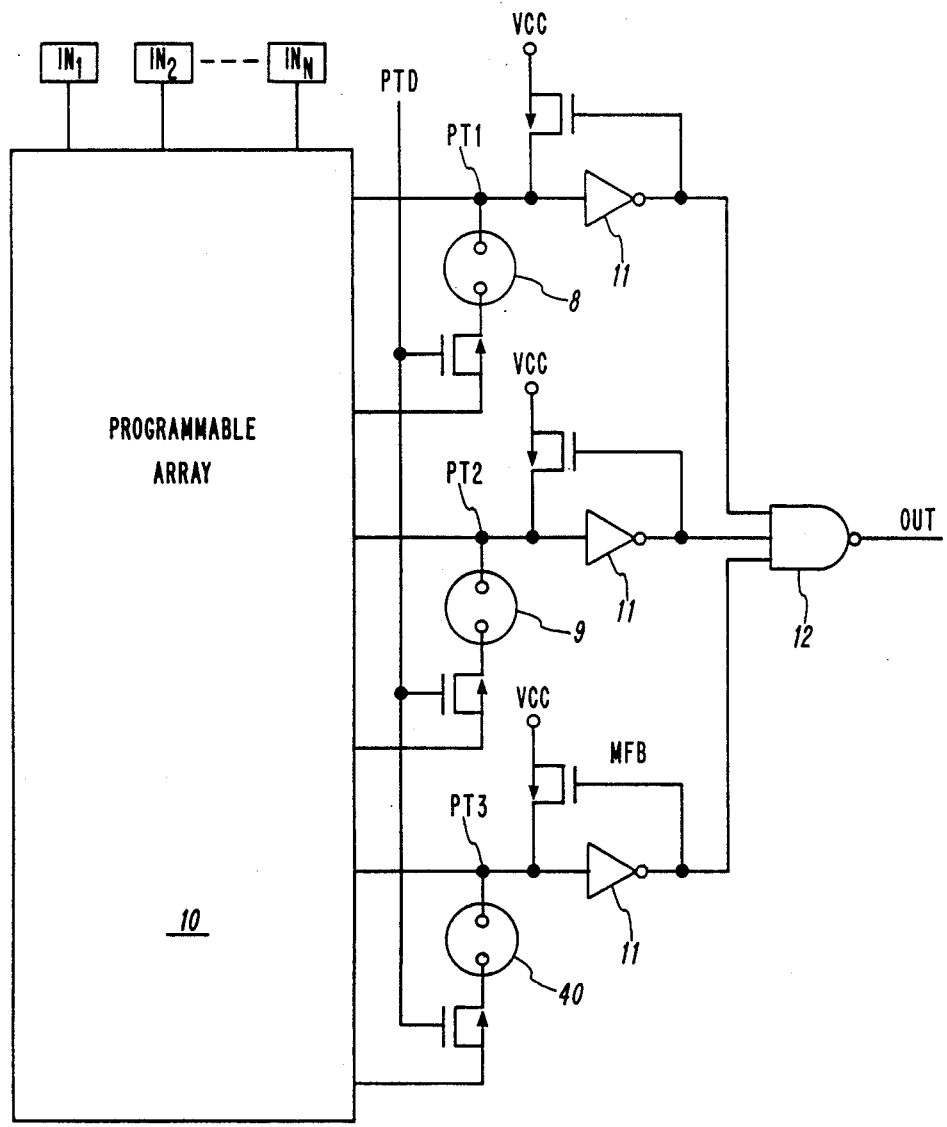
FIG. 1 is a simplified block diagram of a prior art programmable logic device.
Figure 2:
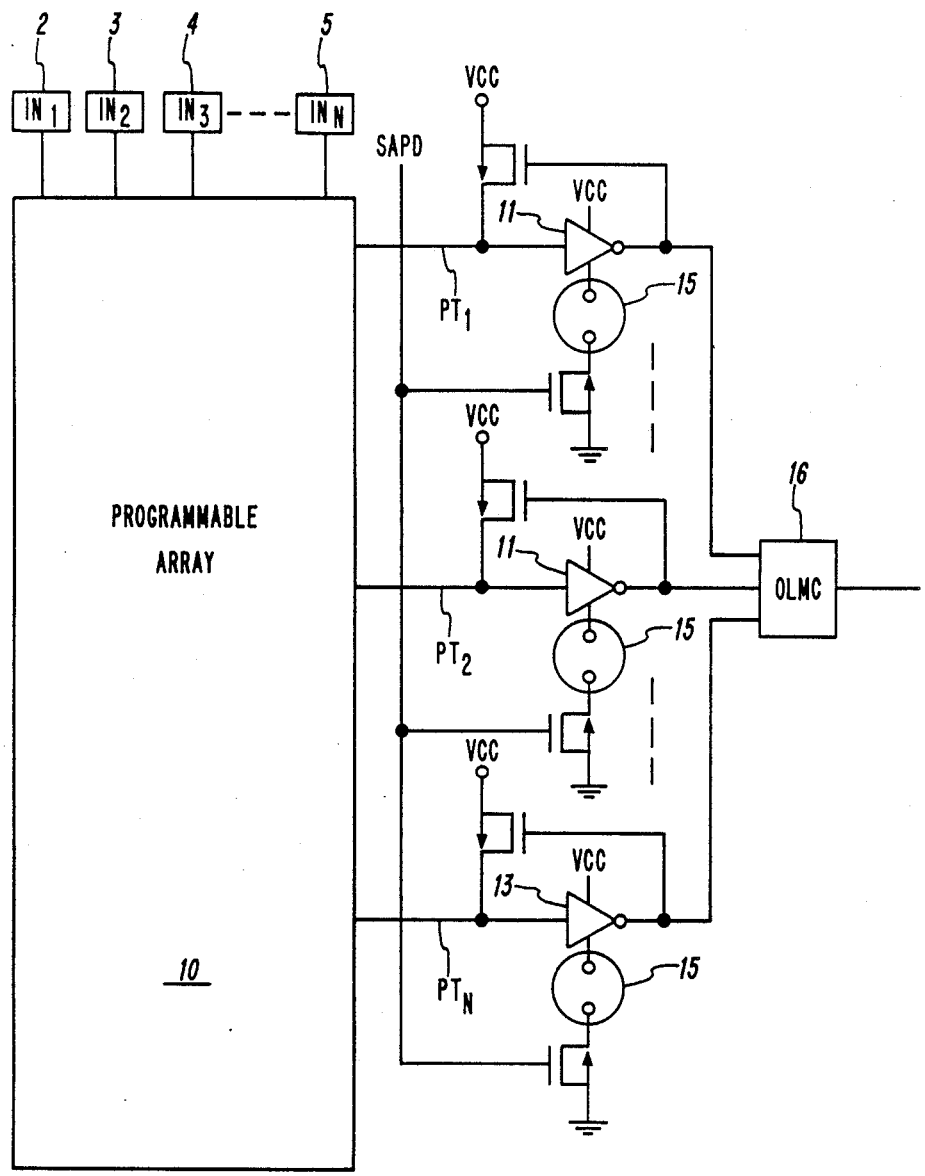
FIG. 2 is a simplified block diagram of a programmable logic device according to the invention.
Figure 3A:
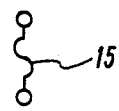
FIG. 3a illustrates a fusable link for programming the switches of FIG. 2.
Figure 3B:
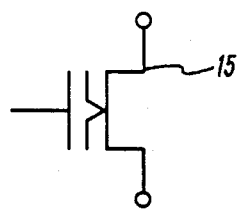
FIG. 3b illustrates the use of an Electrical Erasable Programmable Read Only Memory (EEPROM) transistor for use as the programmable switch in the embodiment of FIG. 2.
Figure 3C:
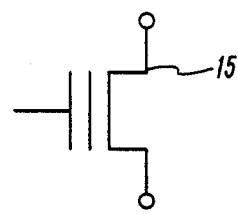
FIG. 3c illustrates the use of an EPROM switch in the embodiment of FIG. 2.
Figure 3D:
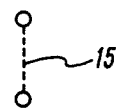
FIG. 3d illustrates the use of a MASK for connection of the switch of FIG. 2.
Figure 3E:
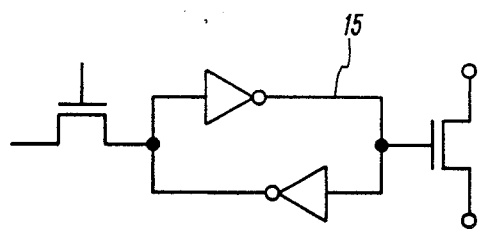
FIG. 3e illustrates the use of a STATIC RAM switching transistor for use as a fusable link in the embodiment of FIG. 2.

FIG. 2, to which reference should now be made, is a simplified diagram of a programmable logic device according to the invention. A plurality of inputs $IN_1$ through $IN_N$ and denoted as 2-5 are applied to the programmable array 10. When an input signal is applied to one or more of the input terms an output will appear on the selected product term lines ($PT_1 PT_2 \ldots$ or $PT_N$) depending on the programming within the programmable array 10. The selected product term line is sensed by either inverting sense amplifier 11 or non-inverting sense amplifier 13 and applied to an output logic macrocell which includes a logic configuration such as that disclosed in a publication entitled "Programmable Logic Manual GAL products" published by SGS-THOMSON Microelectronics in Oct. of 1988 which by reference is incorporated herein. The sense amplifiers, either type, inverting sense amplifier 11 or non-inverting sense amplifier 13, are activated by the application of a sense amplifier power down signal to a switch 15. The switch 15 may be any one of the embodiments shown in FIGS. 3a to 3e provided the appropriate configuration is performed so that the power between Vcc and the return to the sense amplifier, either inverting sense amplifier or non-inverting sense amplifier 13, is applied.

Figure 4:
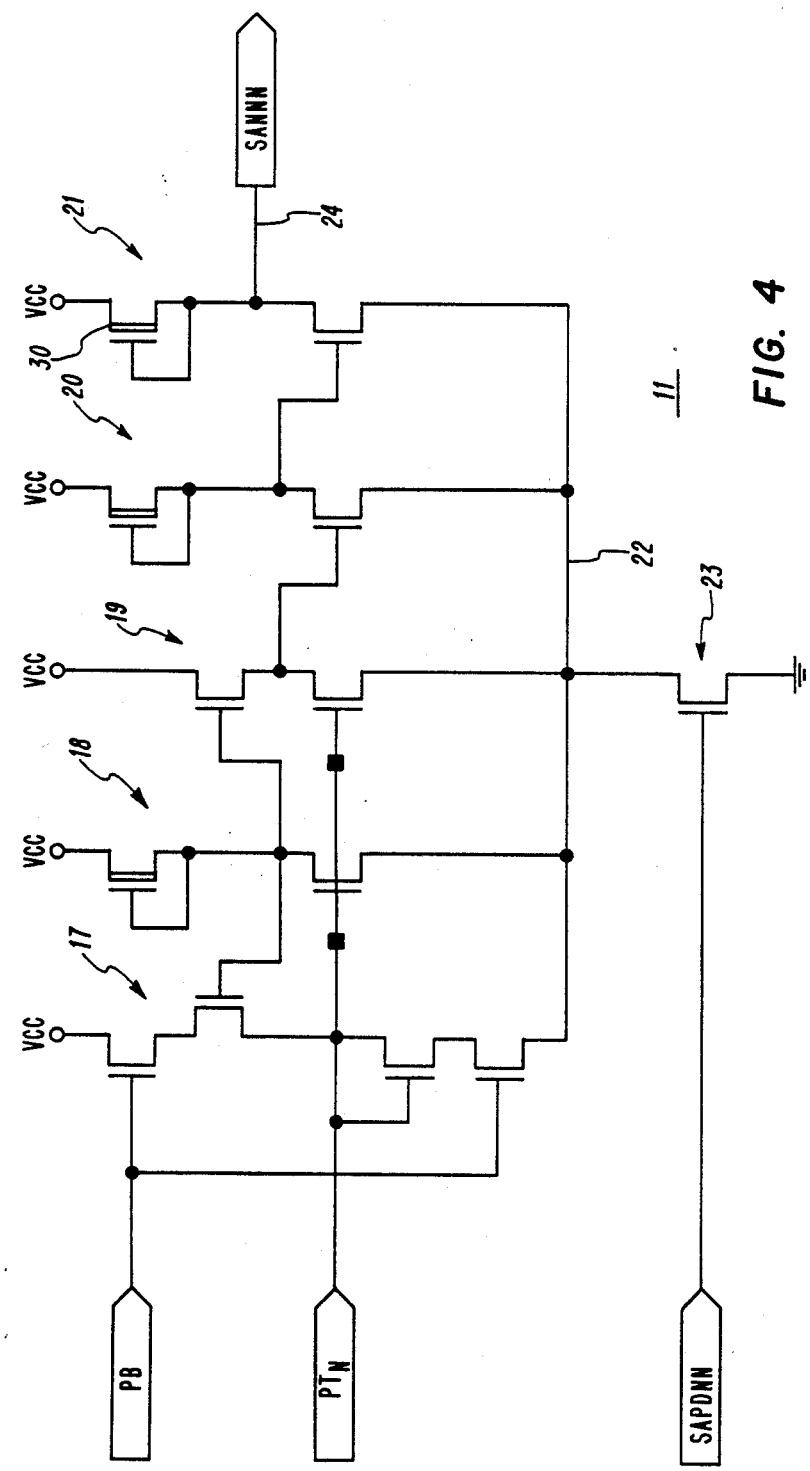
FIG. 4 is a schematic diagram of a first embodiment of the sense amplifier according to the invention.

FIG. 4 is a schematic diagram of a first embodiment of the sense amplifier 11 according to the invention. For speed purposes the circuit is configured with field effect transistors of N channel metal oxide silicon. Vcc is connected across each amplifier stage 17 through 21 and a common return line 22. The common return line is connected via a switching transistor 23 which is controlled by the sense amplifier power down signal SAPDNN that is applied to the switching transistor 23. When the SAPDNN signal is programed to a logic 1 during a configuration of the PLD, the sense amplifier is activated. The product term $PT_N$ on the input line is monitored. PB provides protection to the circuitry during programming. The output of the sense amplifier is provided on terminal 24 and applied to the output logic macrocell 16. Depletion Transistor 30 ensures that the output 24 is at Vcc when the SAPDNN signal is programmed to a logic $\phi$. .

Figure 5:
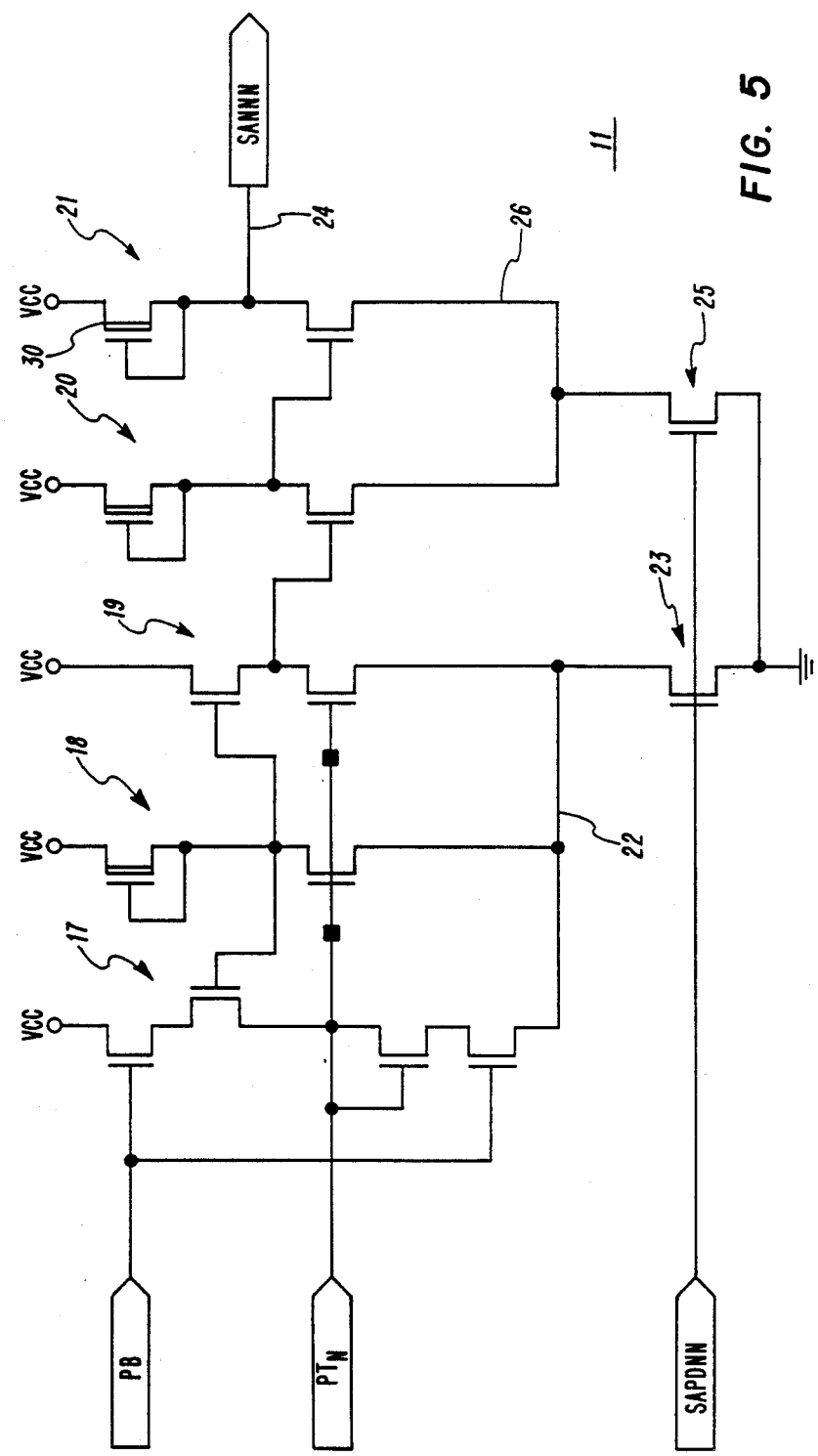
FIG. 5 is a schematic diagram of a second embodiment of the sense amplifier according to the invention.

FIG. 5 is a schematic diagram of a second embodiment of the sense amplifier 11 according to the invention. Similar to the embodiment of FIG. 4, the circuit is configured with field effect transistors of N channel metal oxide silicon. Vcc is connected across each amplifier stage 17 through 21 and as a noise reduction measure the common return line 22 is utilized by the amplifier stages 17, 18, and 19 whereas common return line 26 is utilized by the output amplifier stages 20 and 21. The common return line 22 is connected to power return via the switching transistor 23 and common return 26 is connected to power return via switching transistor 25 which is controlled by the sense amplifier power down signal SAPDNN that also operates switching transistor 23. When the SAPDNN signal is programed to a logic 1 during a configuration of the PLD, the sense amplifier is activated. The product term $PT_N$ on the input line is monitored. PB provides protection to the circuitry during programming. The output of the sense amplifier is provided on terminal 24 and applied to the output logic macrocell 16. Depletion Transistor 30 ensures that the output 24 is at Vcc when the SAPDNN signal is programmed to a logic $\phi$.

Accordingly I claim the following:

1. Sense amplifier circuitry for use in a programmable logic device, comprising:
   a power supply having positive and ground terminals;
   at least one sense amplifier input stage connected to said power supply and having an input terminal connected to a product term signal line of the programmable logic device;
   a sense amplifier output stage connected to said power supply and said sense amplifier input stage at a common node, said output stage having an output signal terminal; and
   a switch connected between one terminal of said power supply and said sense amplifier input stage and said sense amplifier output stage, wherein said switch has a control input, and wherein the application of a selected signal to the control input causes said switch to disconnect the sense amp from the one terminal of said power supply.

2. The sense amplifier circuitry of claim 1, wherein said switch is connected between the power supply ground terminal and said common node, and wherein said output stage includes a pull-up device connected between the output signal terminal and the power supply positive terminal.

3. The sense amplifier circuitry of claim 2, wherein the pull-up device comprises an N-channel depletion mode transistor.

4. The sense amplifier circuitry of claim 1, wherein the selected signal is generated by a non-volatile programmed memory bit.

* * * * *